United States Patent
Kang

(10) Patent No.: US 6,999,214 B2
(45) Date of Patent: Feb. 14, 2006

(54) APPARATUS AND METHOD FOR DETECTING HOLOGRAPHIC DATA REPRODUCED FROM A HOLOGRAPHIC MEDIA

(75) Inventor: Byung-Bok Kang, Seoul (KR)

(73) Assignee: Daewoo Electronics Corp., Seoul (KR)

( * ) Notice: Subject to any disclaimer, the term of this patent is extended or adjusted under 35 U.S.C. 154(b) by 0 days.

(21) Appl. No.: 10/806,145

(22) Filed: Mar. 23, 2004

(65) Prior Publication Data

US 2004/0196517 A1    Oct. 7, 2004

(30) Foreign Application Priority Data

Mar. 31, 2003   (KR) ................... 10-2003-0019976

(51) Int. Cl.
*G03H 1/22*     (2006.01)
(52) U.S. Cl. .................... 359/32; 359/35; 359/22; 359/24
(58) Field of Classification Search .................. 359/32, 359/35, 24, 7, 3, 22; 365/125, 216
See application file for complete search history.

(56) References Cited

U.S. PATENT DOCUMENTS

| | | | |
|---|---|---|---|
| 6,118,560 A | * | 9/2000 | Stappaerts .................... 359/24 |
| 6,320,657 B1 | * | 11/2001 | Aspnes et al. .............. 356/369 |
| 2003/0039000 A1 | * | 2/2003 | Tanaka et al. ................ 359/22 |

FOREIGN PATENT DOCUMENTS

GB          2363895          1/2002

* cited by examiner

*Primary Examiner*—Fayez G. Assaf
(74) *Attorney, Agent, or Firm*—Bacon & Thomas, PLLC

(57) ABSTRACT

In an apparatus for detecting holographic data reproduced from a holographic medium, the holographic medium has an interference pattern and the holographic data is reproduced when a first portion of a reference beam is diffracted by the interference pattern within the holographic medium. A transmission beam detector detects a light intensity of a transmission beam which is a second portion of the reference beam, wherein the transmission beam is not diffracted to reproduce the holographic data and passes through the holographic medium. Then, a CCD (charge coupled device) controller generates a driving signal in accordance with the detected light intensity. Thereafter, a CCD detects the holographic data in response to the driving signal.

15 Claims, 3 Drawing Sheets

APPARATUS AND METHOD FOR DETECTING HOLOGRAPHIC DATA REPRODUCED FROM A HOLOGRAPHIC MEDIA

FIELD OF THE INVENTION

The present invention relates to a holographic data reconstruction system; and, more particularly, to an apparatus and a method for reconstructing holographic data, which are capable of detecting the holographic data by controlling timing for driving CCD (charge coupled device).

BACKGROUND OF THE INVENTION

As is well known, demands for a volume holographic digital data storage system that can store a large amount of data, such as data for a motion picture film, have been increasing and various types of holographic digital data storage system have been recently developed for realizing high density optical storage capabilities.

The volume holographic digital data storage system allows a signal beam having information therein to interfere with a reference beam to generate an interference pattern therebetween and, then, controls the interference pattern to be stored in a storage medium made of an optical refractive crystal. The optical refractive crystal is a material which may react differently on different amplitudes and phases of the interference pattern.

Various holograms can be recorded in the storage medium by changing an angle of incidence of the reference beam (angular multiplexing) and/or by moving the storage medium to change a recording area (shift multiplexing), so that a great number of holograms of binary data can be stored in the storage medium on a page-by-page basis.

An example of the conventional apparatus for storing and reconstructing holographic data is described in U.S. Pat. No. 6,490,061 B1.

FIG. 1 depicts a block diagram of a conventional apparatus for storing and reconstructing holographic data, which includes a light source 100, a beam splitter 102, a shutter 104, a spatial light modulator (SLM) 106, a first and a second reflection mirror 108 and 110, a first to a third lens 112, 114 and 118, a holographic medium 116 and a charge coupled device (CCD) 120.

The light source 100 generates a laser beam. The beam splitter 102 splits the laser beam into a reference beam and a signal beam, wherein the separated reference and signal beams travel along two different optical paths. The first and second reflection mirrors 108 and 110 reflect the reference beam. Next, the reference beam is transferred to the holographic medium 116 via the first lens 112.

The shutter 104 stays open in a recording mode to allow the signal beam to be transferred to the SLM 106. At the SLM 106, the signal beam is modulated into binary pixel data on a page-by-page basis based on input data applied to the SLM 106. The modulated signal beam travels to the holographic medium 116 via the second lens 114.

The interference pattern of the modulated signal beam interfering with the reference beam is stored in a specific spot within the holographic medium 116, wherein the interference pattern is correspondent to the input data applied to the SLM 106.

In this case, the holographic data are multiplexed before being stored in the holographic medium 116 by using, e.g., the shift multiplexing and/or the angular multiplexing in a predetermined way. Hereinafter, for simplicity, the apparatus employing only the shift multiplexing will be described herein.

During a reconstruction mode, the shutter 104 remains to be closed so that a signal beam cannot be introduced to the holographic medium 116. Accordingly, only a reference beam is irradiated onto the holographic medium 116 from the first lens 112.

When a reference beam is irradiated onto a spot where an interference pattern is recorded, a first portion of the reference beam is diffracted by the interference pattern, so that recorded binary data corresponding to an image to be displayed on the CCD 120 via a third lens 118 can be reproduced on the page-by-page basis. Meanwhile, a second portion of the reference beam may pass through the holographic medium 116.

Next, in the CCD 120, the demodulated signal from the spot of holographic medium 116 is converted to an electrical signal, i.e., an original data.

Finally, a decoder (not shown) may decode the electrical signal into two binary values, i.e., "0" and "1", by comparing, e.g., a light intensity of the electrical signal with a threshold value.

In order to reproduce the holographic data, a servo system such as a linear stage can be used. The servo system may have position data representing locations where interference patterns have been recorded. The servo system controls the locations where reference beams are to be irradiated by using, e.g., a DC servo motor. In case of the shift multiplexing, the servo system can find a spot where an interference pattern has been stored by, e.g., moving the holographic medium 116 based on the position data, so that a reference beam is to be irradiated onto the spot. If the reference beam is irradiated onto the spot, the holographic data recorded in the spot are reproduced, so that the CCD 120 can capture the holographic data. A reconstruction process such as above may be repeated in accordance with the position data by the servo system. In this way, however, the position data should include information on precise data locations and the servo system should control the locations in accordance with the position data in high accuracy.

Alternatively, in a recording mode, a specific mark can be recorded on each page together with an interference pattern corresponding to input data applied to the SLM 106 in the holographic medium 116. The specific mark can be used to represent the presence of the interference pattern in a reading mode. By using the shift multiplexing, reference beams are irradiated onto the holographic medium 116 in a predetermined way. In this case, if a specific mark is reproduced and then detected at a detector (not shown) when a reference beam is irradiated onto a spot, an interference pattern must have been recorded in the spot. At this time, since the holographic data recorded in the spot are also reproduced, the detector allows the CCD 120 to capture the holographic data. In this way, the servo system and the position data such as above are not required. However, surplus space for recording the specific mark is needed in the holographic medium 116. Therefore, a recording capacity of the holographic medium 116 may be decreased.

SUMMARY OF THE INVENTION

It is, therefore, an object of the present invention to provide an apparatus and a method for reconstructing holographic data, which are capable of detecting the holographic data by controlling timing for driving CCD (charge coupled device).

In accordance with one aspect of the invention, there is provided an apparatus for detecting holographic data reproduced from a holographic medium, wherein the holographic medium has an interference pattern and the holographic data is reproduced when a first portion of a reference beam is diffracted by the interference pattern within the holographic medium, including: a transmission beam detector for detecting a temporal light intensity of a transmission beam which is a second portion of the reference beam, wherein the transmission beam is not diffracted to reproduce the holographic data and passes through the holographic medium; a CCD controller for generating a driving signal in accordance with the detected light intensity; and a CCD for detecting the holographic data in response to the driving signal.

In accordance with another aspect of the invention, there is provided an apparatus for reconstructing holographic data, including: a light source for generating a laser beam; a beam splitter for splitting the laser beam into a reference beam and a signal beam; a holographic medium for storing an interference pattern generated through an interference of the reference beam with the signal beam; and a detecting unit for detecting the holographic data reproduced from the holographic medium based on a transmission beam which is not diffracted by the interference pattern to reproduce the holographic data and passes through the holographic medium.

In accordance with still another aspect of the invention, there is provided a method for detecting holographic data reproduced from a holographic medium, wherein the holographic medium has an interference pattern and the holographic data is reproduced when a first portion of a reference beam is diffracted by the interference pattern within the holographic medium, including the steps of: detecting a temporal light intensity of a transmission beam which is a second portion of the reference beam, wherein the transmission beam is not diffracted to reproduce the holographic data and passes through the holographic medium; generating a driving signal in accordance with the detected light intensity; and detecting the holographic data in response to the driving signal.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

A preferred embodiment of the present invention will now be described hereinafter with reference to the drawings.

Figure 2:
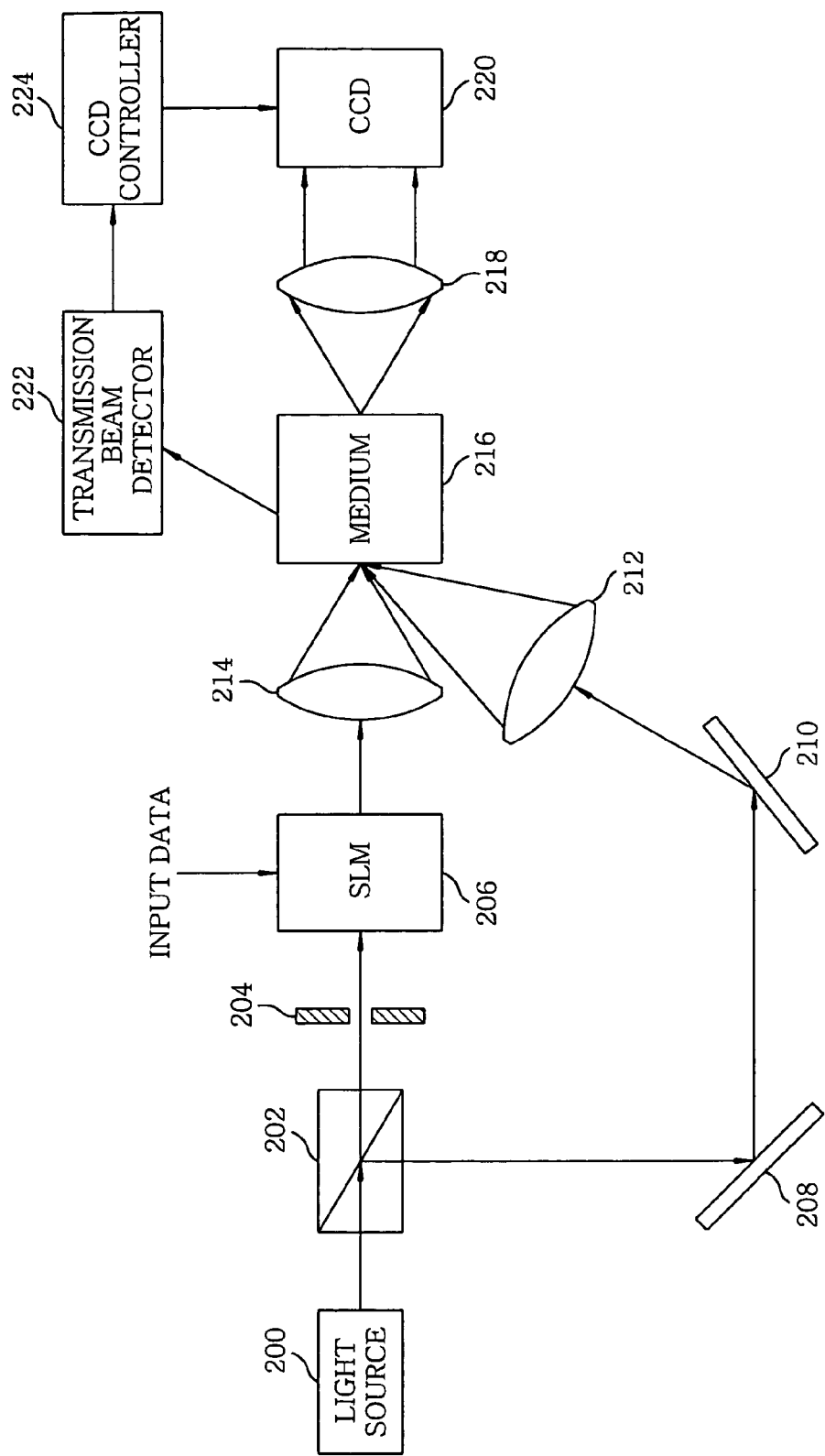
FIG. 2 shows a schematic view of an apparatus for storing and reconstructing holographic data in accordance with a preferred embodiment of the present invention.

FIG. 2 shows a schematic view of an apparatus for storing and reconstructing holographic data in accordance with the preferred embodiment of the present invention.

Figure 1:
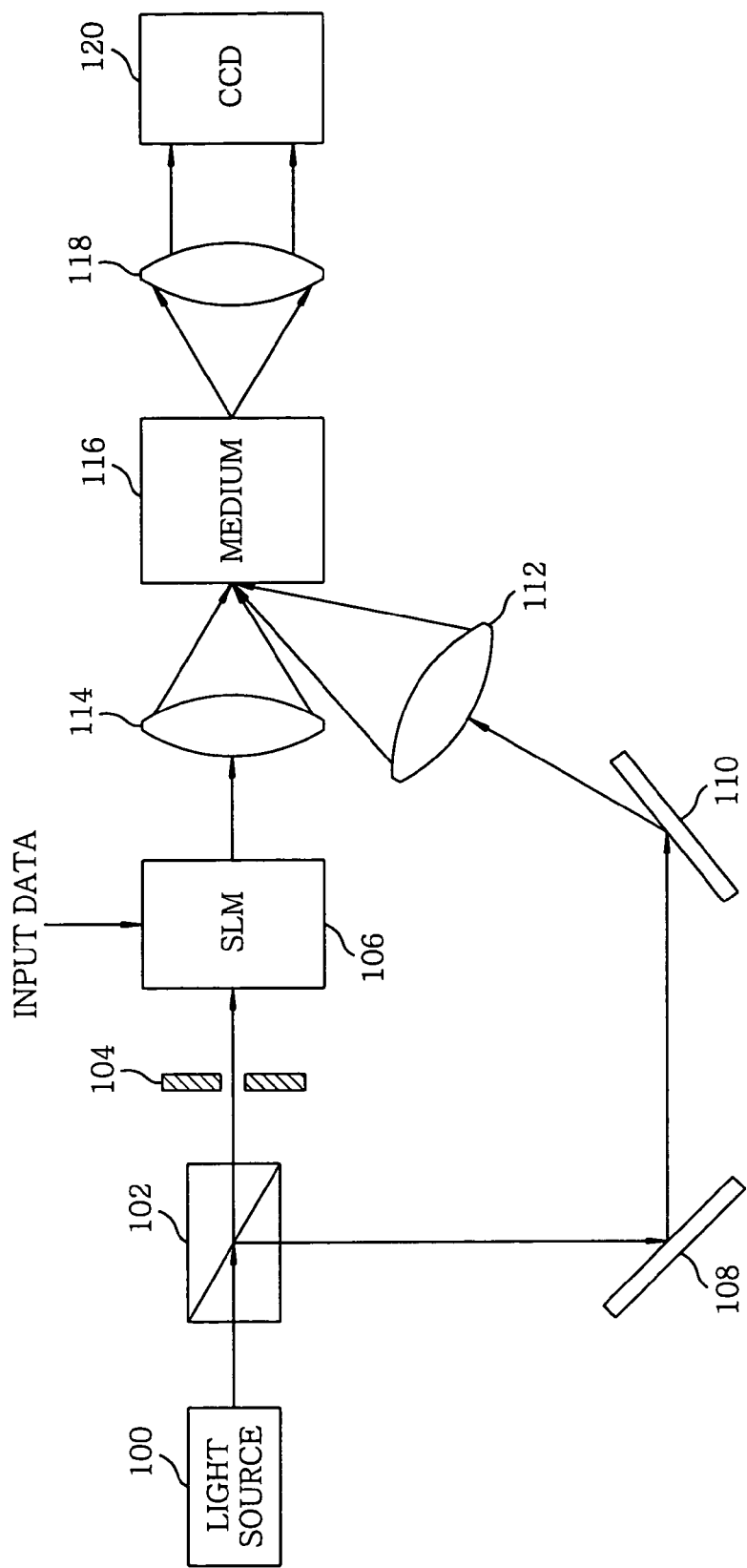
FIG. 1 illustrates a schematic view of a conventional apparatus for storing and reconstructing holographic data.

The apparatus of the preferred embodiment of the present invention is generally identical to that of the prior art shown in FIG. 1, excepting for a transmission beam detector 222 and a CCD controller 224 added thereto. The functions of the other parts of the apparatus except for the transmission beam detector 222 and the CCD controller 224 are basically identical to those of the prior art, and therefore descriptions on the operations thereof will not be repeated.

A light source 200 emits a laser beam and a holographic medium 216 such as a photo-refractive crystal stores therein holographic data.

A beam splitter 202 splits the laser beam into two beams, e.g., a reference beam reflected thereby to travel along a reference beam path and a signal beam transmitted therethrough along a signal beam path.

Prepared on the reference beam path are a first reflection mirror 208, a second reflection mirror 210 and a first lens 212, disposed in that order therealong. That is, the reference beam travels to the holographic medium 216 via the first reflection mirror 208, the second reflection mirror 210 and the first lens 212.

On the signal beam path, a shutter 204, an SLM 206 and a second lens 214 are successively installed in a proceeding direction of the signal beam. The SLM 206 modulates the signal beam transmitted from the beam splitter 202 into the binary pixel data on a page-by-page basis based on input data applied to the SLM 206. The modulated signal beam then travels to the holographic medium 216 via the second lens 214 to form an interference pattern in the holographic medium 216.

Before being stored in the holographic medium 216, the holographic data are multiplexed by using, e.g., a shift multiplexing and an angular multiplexing in a predetermined way.

During a reading operation, the shutter 204 remains to be closed so that a signal beam cannot be introduced to the holographic medium 216. Accordingly, only a reference beam is irradiated onto the holographic medium 216 through the first lens 212.

In the preferred embodiment of the present invention, reference beams are irradiated onto the holographic medium 216 based on the shift multiplexing and the angular multiplexing in the predetermined way such as above. Hereinafter, for simplicity, the apparatus employing only the shift multiplexing will be described herein.

When a reference beam is irradiated onto a spot where an interference pattern is recorded, a first portion of the reference beam is diffracted by the interference pattern, so that recorded binary data corresponding to an image to be displayed on a CCD 220 via a third lens 218 can be reproduced on the page-by-page basis. In the meantime, a second portion of the reference beam is not diffracted to restore the holographic data but passes through the holographic medium 216 (hereinafter, referred to as a transmission beam).

The major principle of the preferred embodiment of the present invention lies in that, when a reference beam is irradiated onto a recording area within the holographic medium 216, a light intensity of the first portion of the reference beam, i.e., the diffracted reference beam, is increased while that of the second portion of the reference beam, i.e., the transmission beam, is decreased. In the mean time, when a reference beam is irradiated onto a non-recording area within the holographic medium 216, a light intensity of the diffracted reference beam is decreased while that of the transmission beam is increased.

A detecting unit for detecting the holographic data may include the transmission beam detector 222, the CCD controller 224 and the CCD 220. The detecting unit is capable of controlling timing for detecting the holographic data by using the light intensity of the transmission beam.

Figure 3:
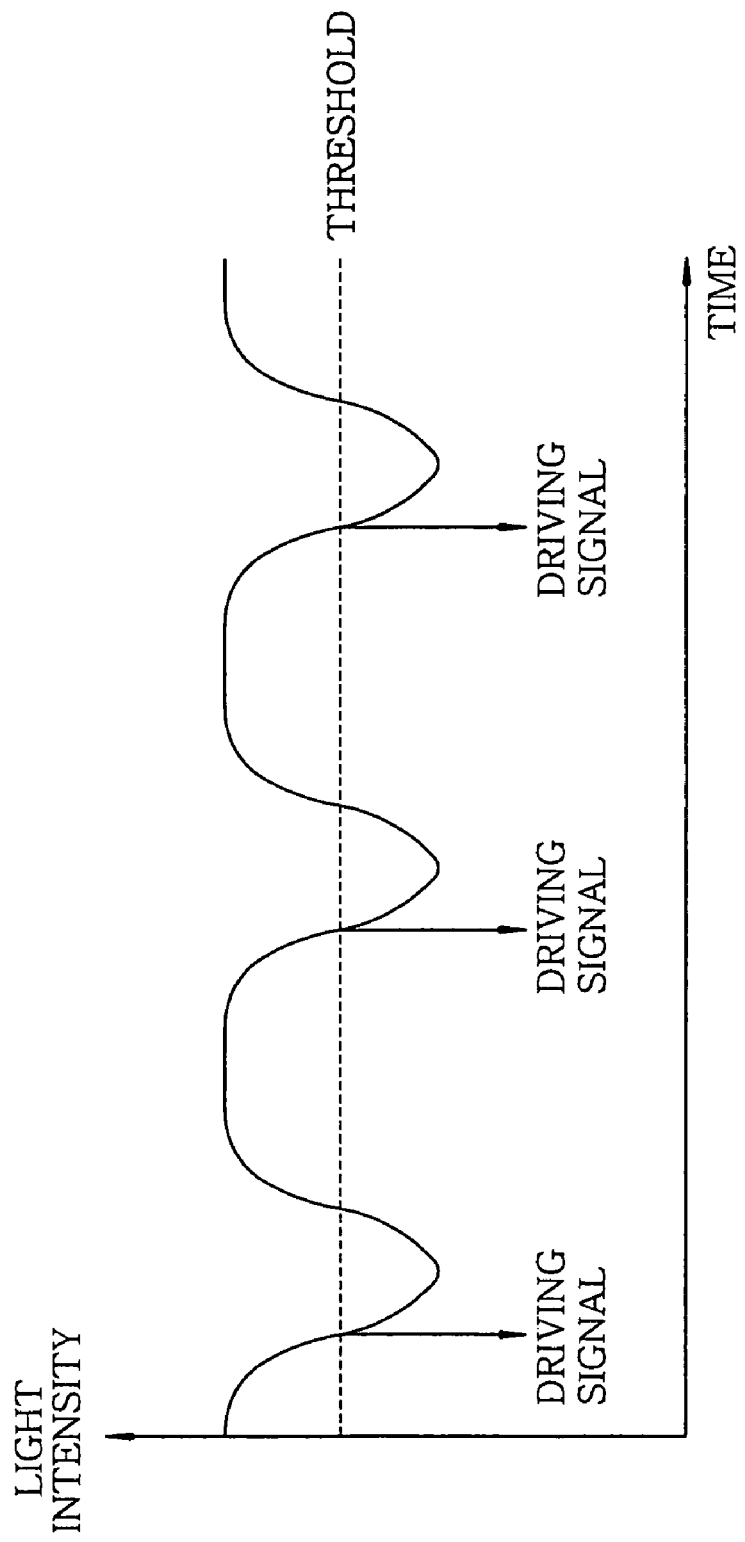
FIG. 3 exhibits an exemplary profile of a temporal light intensity of a transmission beam detected from a transmission beam detector.

In detail, the transmission beam detector 222 detects a temporal light intensity of a transmission beam and then transmits the temporal light intensity to the CCD controller 224. FIG. 3 exhibits an exemplary profile of the temporal light intensity of the transmission beam detected at the transmission beam detector 222. The light intensity of the transmission beam may form a periodical curve, e.g., a sine curve, over time.

The reduction or decrease of the temporal light intensity of the transmission beam means that a first portion of a reference beam is used to reproduce the holographic data. In other words, if the light intensity detected at the transmission beam detector 222 is reduced when the reference beam is irradiated onto a specific spot, an interference pattern must have been recorded in the spot within the holographic medium 216.

The CCD controller 224 determines timing for detecting the holographic data in accordance with the light intensity received from the transmission beam detector 222. For example, when the detected light intensity falls below a threshold value; that is, the light intensity changes from a larger value to a smaller value than the threshold value, the CCD controller 224 generates a driving signal for driving the CCD 220 and then sends the driving signal to the CCD 220. It is understood that the CCD controller 224 can generate the driving signal in a predetermined time after the light intensity falls below the threshold value.

In response to the driving signal, the CCD 220 may capture the holographic data reproduced from the spot of the holographic medium 216. That is, the CCD 220 may capture the holographic data, e.g., either as soon as the driving signal is received or in a predetermined time after the driving signal is received.

Subsequently, the holographic data captured from the CCD 220 may be transmitted to a decoder (not shown) for decoding the holographic data into two binary values.

In the preferred embodiment of the present invention, a reference beam is irradiated onto the holographic medium 216 based on the shift multiplexing in the predetermined way, so that the CCD controller 224 can make the CCD 220 capture the holographic data reproduced from the holographic medium when the light intensity of the second part of the reference beam, i.e., the transmission beam, is reduced.

Therefore, the preferred embodiment of the present invention need not use position data representing precise locations where interference patterns have been recorded as well as a servo system such as a linear stage. Further, in the preferred embodiment of the present invention, a specific mark representing the presence of an interference pattern within the holographic medium 216 is not required, so that a recording capacity of the holographic medium 216 can be increased.

Therefore, the embodiment of the present invention is capable of detecting the holographic data by controlling timing for driving the CCD.

While the invention has been shown and described with respect to the preferred embodiments, it will be understood by those skilled in the art that various changes and modifications may be made without departing from the spirit and scope of the invention as defined in the following claims.

What is claimed is:

1. An apparatus for detecting holographic data reproduced from a holographic medium, wherein the holographic medium has an interference pattern and the holographic data is reproduced when a first portion of a reference beam is diffracted by the interference pattern within the holographic medium, comprising:

a transmission beam detector for detecting a temporal light intensity of a transmission beam which is a second portion of the reference beam, wherein the transmission beam is not diffracted to reproduce the holographic data and passes through the holographic medium;

a CCD (charge coupled device) controller which generates a driving signal in accordance with the detected light intensity for determining timing in order to detect the holographic data; and a CCD for detecting the holographic data in response to the driving signal.

2. The apparatus of claim 1, wherein the CCD controller generates the driving signal when the temporal light intensity of the transmission beam falls below a threshold value.

3. The apparatus of claim 1, wherein the CCD controller generates the driving signal in a predetermined time after the temporal light intensity of the transmission beam falls below a threshold value.

4. The apparatus of claim 1, wherein the CCD captures the holographic data on receiving the driving signal.

5. The apparatus of claim 1, wherein the temporal light intensity of the transmission beam forms a periodical curve over time.

6. An apparatus for reconstructing holographic data, comprising:

a light source for generating a laser beam;

a beam splitter for splitting the laser beam into a reference beam and a signal beam;

a holographic medium for storing an interference pattern generated through an interference of the reference beam with the signal beam; and a detecting unit for detecting the holographic data reproduced from the holographic medium based on a transmission beam which is not diffracted by the interference pattern to reproduce the holographic data and passes through the holographic medium, wherein the detecting unit includes:

a transmission beam detector for detecting a temporal light intensity of the transmission beam;

a CCD controller which generates a driving signal in accordance with the detected light intensity for determining timing in order to detect the holographic data; and a CCD for detecting the holographic data in response to the driving signal.

7. The apparatus of claim 6, wherein the CCD controller generates the driving signal when the temporal light intensity of the transmission beam falls below a threshold value.

8. The apparatus of claim 6, wherein the CCD controller generates the driving signal in a predetermined time after the temporal light intensity of the transmission beam falls below a threshold value.

9. The apparatus of claim 6, wherein the CCD captures the holographic data on receiving the driving signal.

10. The apparatus of claim 6, wherein the temporal light intensity of the transmission beam forms a periodical curve over time.

11. A method for detecting holographic data reproduced from a holographic medium, wherein the holographic medium has an interference pattern and the holographic data is reproduced when a first portion of a reference beam is diffracted by the interference pattern within the holographic medium, comprising the steps of:

detecting a temporal light intensity of a transmission beam which is a second portion of the reference beam, wherein the transmission beam is not diffracted to reproduce the holographic data and passes through the holographic medium;

generating a driving signal in accordance with the detected light intensity for determining timing in order to detect the holographic data; and detecting the holographic data in response to the driving signal.

12. The method of claim 11, wherein the driving signal is generated when the temporal light intensity of the transmission beam falls below a threshold value.

13. The method of claim 11, wherein the driving signal is generated in a predetermined time after the temporal light intensity of the transmission beam falls below a threshold value.

14. The method of claim 11, wherein the holographic data are captured on the driving signal being received.

15. The method of claim 11, wherein the temporal light intensity of the transmission beam forms a periodical curve over time.

* * * * *